United States Patent [19]

Chan

[11] Patent Number: 5,892,243
[45] Date of Patent: Apr. 6, 1999

[54] HIGH-TEMPERATURE SSNS AND SNS JOSEPHSON JUNCTION AND METHOD OF MAKING JUNCTION

[75] Inventor: Hugo W. Chan, Palos Verdes Estates, Calif.

[73] Assignee: TRW Inc., Redondo Beach, Calif.

[21] Appl. No.: 761,412

[22] Filed: Dec. 6, 1996

[51] Int. Cl.$^6$ ...................................................... H01L 29/06
[52] U.S. Cl. ............................... 257/31; 257/33; 257/35; 505/190
[58] Field of Search .................................. 257/30, 31, 32, 257/33, 34, 35, 36, 37, 38, 39; 505/190

[56] References Cited

U.S. PATENT DOCUMENTS

| | | | |
|---|---|---|---|
| 4,414,738 | 11/1983 | Jelks et al. ................................. | 29/579 |
| 4,432,134 | 2/1984 | Jones et al. ................................. | 29/578 |
| 4,454,522 | 6/1984 | De Lozanne ................................. | 357/5 |
| 5,134,117 | 7/1992 | DiIorio et al. ............................. | 505/190 |
| 5,256,636 | 10/1993 | Wellstood et al. ........................... | 505/1 |
| 5,266,558 | 11/1993 | Lichtenberg et al. ....................... | 505/1 |
| 5,280,013 | 1/1994 | Newman et al. ............................. | 505/1 |
| 5,291,035 | 3/1994 | Wellstood et al. .......................... | 257/33 |
| 5,322,817 | 6/1994 | James et al. ............................... | 505/474 |
| 5,367,178 | 11/1994 | DiIorio et al. ............................. | 505/1 |
| 5,378,683 | 1/1995 | Cabanel et al. ............................ | 505/190 |
| 5,389,606 | 2/1995 | Face ........................................ | 505/473 |
| 5,399,881 | 3/1995 | Bozovic et al. ............................ | 505/190 |
| 5,430,014 | 7/1995 | Soltner et al. ............................ | 505/238 |
| 5,432,149 | 7/1995 | Schuller et al. ........................... | 505/329 |
| 5,439,877 | 8/1995 | Face ........................................ | 505/475 |
| 5,472,934 | 12/1995 | Akoh et al. ............................... | 505/190 |
| 5,488,030 | 1/1996 | Tanaka et al. ............................. | 505/190 |
| 5,508,255 | 4/1996 | Eddy ....................................... | 505/473 |
| 5,523,283 | 6/1996 | Simon et al. .............................. | 505/239 |
| 5,534,491 | 7/1996 | Nakamura et al. .......................... | 505/500 |
| 5,627,139 | 5/1997 | Chin et al. ............................... | 505/238 |
| 5,696,392 | 12/1997 | Char et al. ............................... | 257/190 |

OTHER PUBLICATIONS

Strikovskiy, M.D. et al., "Ramp–type $YBa_2Cu_3O_{7-\delta}$ Josephson junctions with high characteristic voltage, fabricated by a new, completely in situ, growth technique," *Appl. Phys. Lett.* 69(19):2918–2920 (1996).

*Primary Examiner*—Sara Crane
*Attorney, Agent, or Firm*—Michael S. Yatsko

[57] ABSTRACT

A high temperature superconductor junction and a method of forming the junction are disclosed. The junction 40 comprises a first high-$T_c$ superconductive layer (first base electrode layer) 46 on a substrate 42 and a dielectric layer 48 on the first high-$T_c$ superconductive layer. The dielectric layer and the first high-$T_c$ superconductive layer define a ramp edge 50. A trilayer SNS structure 52 is disposed on the ramp edge to form an SSNS junction. The SNS structure comprises a second high-$T_c$ superconductive layer (second base electrode layer) 54 directly on the first high-$T_c$ superconductive layer, a normal barrier layer 56 on the second high-$T_c$ superconductive layer, and a third high-$T_c$ superconductive layer 58 (counterelectrode) on the barrier layer. The ramp edge is typically formed by photoresist masking and ionmilling. A plasma etch step can be performed in-situ to remove the photoresist layer 62 following formation of the ramp edge. A normal-superconductive (NS) structure can be optimally formed directly on the ramp edge following the plasma etch step to form an SNS junction 70. The SNS and NS structures are preferably formed in-situ.

9 Claims, 6 Drawing Sheets

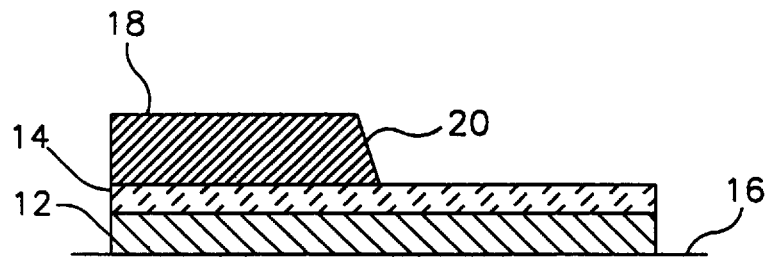
FIG. IA
PRIOR ART
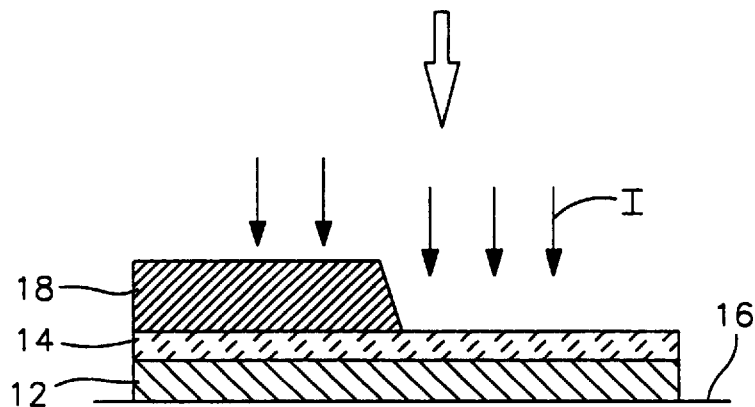
FIG. IB
PRIOR ART

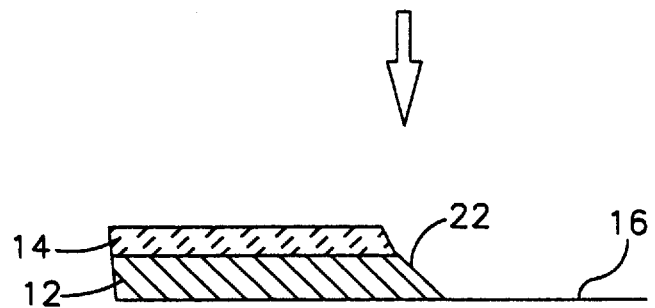
FIG. IC
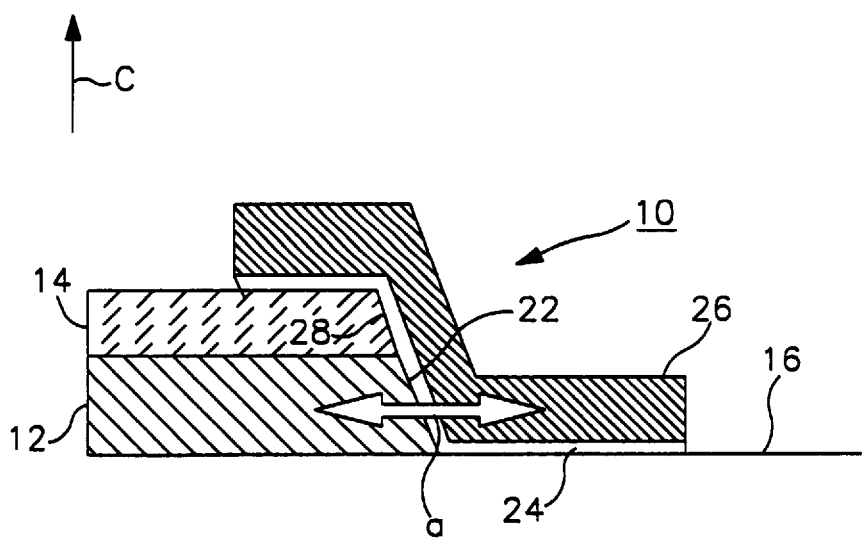
FIG. ID

HIGH-TEMPERATURE SSNS AND SNS JOSEPHSON JUNCTION AND METHOD OF MAKING JUNCTION

BACKGROUND

The invention is directed to the field of superconducting Josephson junctions and, more particularly, to a high-temperature superconductive—superconductive-normal-superconductive (SSNS) Josephson junction and a high-temperature superconductive-normal-superconductive (SNS) Josephson junction and a method of making the junctions.

High-temperature superconductive (HTS) materials have a normal-to-superconducting transition temperature, $T_c$, of more than 25 K. At lower temperatures, these materials exhibit no resistance to electrical current flow. High-$T_c$ superconductive materials are used in HTS circuits. In comparison to low-temperature superconductive (LTS) circuits, HTS circuits operate at significantly higher temperatures, typically about 25–100 K as compared to about 4–10 K for LTS circuits. HTS circuits are highly advantageous as compared to LTS circuits due to their relatively reduced cooling and insulation requirements.

HTS circuits can be used in a wide range of defense, industrial and commercial applications. HTS circuits can be used in analog-to-digital (ADC) applications such as analog signal processors (ASP), digital signal processors (DSP), high-speed computers, asynchronous transfer mode (ATM), switching networks, telecommunications, commercial satellites; rf applications such as resonators, band-pass filters, phased-array antennae for cellular/satellite telecommunications; and sensors such as magnetic sensors for mine-detection, anti-submarine warfare, and bio-magnetic diagnostic and non-destructive magnetic sensors.

HTS circuits are a vital next generation technology capable of replacing existing semiconductor technologies and having a tremendous growth potential within the next decade.

Despite providing important advantages, known HTS circuits have performance limiting problems as well. One basic problem of HTS circuits is the non-uniformity of the active devices. The basic active device used in HTS circuits is the Josephson junction. A key junction technology is the SNS Josephson junction. SNS Josephson junctions include two superconductive layers and an intermediate barrier layer (N layer) comprised of a normal material. During operation, a supercurrent flows through the barrier layer via the Josephson tunneling effect.

In known ramped high-$T_c$ SNS Josephson junctions, the SNS junction is formed by depositing the normal barrier layer and a high-$T_c$ superconductive counterelectrode layer on a ramped high-$T_c$, superconductive base electrode. One of the performance-limiting problems associated with known ramped SNS junctions is the occurrence of interfacial electric resistance at the base electrode/normal barrier layer interface at the ramp edge. This interfacial resistance is the result of the conventional fabrication process used to form the junction. Particularly, the base electrode is exposed to ambient conditions and to chemical treatments during the patterning process. As a result, the top several monolayers of the base electrode are degraded and deoxygenated, reducing the quality of these monolayers as compared to the bulk of the layer, and producing a resistive and/or nonuniform interface.

A resistive and/or non-uniform junction interface adversely affects process quality control by increasing the non-uniformity of the junction characteristics.

A technique that has been used in an attempt to overcome the problem of interfacial resistance in SNS junctions is low-energy ion-etch cleaning of the interface surface, either ex-situ before depositing the normal barrier layer and the counterelectrode layer, or, alternately, in-situ in the same vacuum system in which the barrier layer and counterelectrode layer are deposited. Ion-etch cleaning invariably also produces lattice damage in the exposed ramp edge of the base electrode, adversely affecting the interfacial electrical properties. Thus, this technique has not overcome the problem of interfacial resistance between the base electrode and the normal barrier layer in known SNS junctions.

A known technique of fabricating high-$V_c$ SNS Josephson junctions in-situ employs shadow masking. Particularly, a shadow mask is patterned on the substrate, and the base electrode is deposited by orienting a source at an angle relative to the shadow mask to form the ramp edge. The substrate is then rotated, and the barrier layer and the counterelectrode layer are deposited with the source oriented at a vertical angle relative to the substrate. The shadow mask is then removed.

This technique has proven less than satisfactory because the steps for forming the ramp edge are directional dependent and, so, junctions cannot be fabricated in an arbitrary direction of the substrate. This factor is a major limitation in integrated circuit process technology. In addition, the substrate cannot be rotated during the deposition process; consequently, the thickness of each of the deposited layers can vary significantly across the substrate. This non-uniformity is particularly severe in off-axis sputtering techniques which form a thickness gradient across the substrate unless the substrate is rotated, or unless special techniques are employed to randomize material deposition across the substrate.

Thus, there is a need for an improved high-$T_c$ Josephson junction that (i) overcomes the problem of electrical resistance at the base electrode/normal barrier layer interface and preserves the quality of the interfaces between the normal barrier layer and the adjacent superconductive layers; (ii) provides enhanced junction $I_c$, and enhanced junction $V_c$ uniformity; and (iii) can be formed by a non-directional dependent process.

SUMMARY

The present invention satisfies the above needs. The present invention provides an improved high-$T_c$, superconductive—superconductive-normal-superconductive (SSNS) Josephson junction and a method of making the SSNS junction. The present invention also provides an improved high-$T_c$ superconductive-normal-superconductive (SNS) junction and a method of making the SNS junction. More specifically, the high-$T_c$, SSNS and SNS Josephson junctions (i) eliminate the problem of electrical resistance at the base electrode/normal barrier layer interface and preserves the quality of the interfaces between the normal barrier layer and the adjacent superconductive layers; (ii) provide enhanced junction $I_c$, and enhanced $V_c$ uniformity; (iii) provide reduced parasitic junction leakage current; and (iv) are formed by a nondirectional dependent process.

The high-$T_c$ SSNS Josephson junction according to the present invention is formed on a suitable substrate typically comprised of a dielectric material. The junction comprises a first high-$T_c$, superconductive (HTS) layer on the substrate, and a dielectric layer on the first HTS layer. The first HTS layer and the dielectric layer define a ramp edge.

A trilayer SNS structure is disposed on the ramp edge to form a four-layer SSNS junction. The trilayer SNS structure comprises a second high-$T_c$ superconductive (HTS) layer directly on the ramp edge, a barrier layer of a normal material (i.e., a material that is non-superconductive at the operating temperature of the junction) on the second HTS layer, and a third high-$T_c$ superconductive (HTS) layer on the barrier layer. The first and second HTS layers form a two-layer base electrode. The second HTS layer is thinner than the first HTS layer. The third HTS layer functions as the counterelectrode in the SSNS Josephson junction.

The first, second and third HTS layers are typically comprised of the same high-$T_c$ superconductive material.

According to the present invention, the method of forming the high-$T_c$ SSNS Josephson junction comprises depositing the first HTS layer on the substrate; depositing the dielectric layer on the first HTS layer; and forming the ramp edge on the first HTS layer and the dielectric layer.

Next, the trilayer SNS structure is formed on the ramp edge by sequentially depositing the second HTS layer on the ramp edge; the barrier layer on the second HTS layer; and the third HTS layer on the barrier layer.

The ramp edge is formed using a conventional photoresist masking technique. To prevent contamination of the ramp edge prior to formation of the SNS structure, the photoresist layer disposed on the dielectric layer is preferably removed in-situ using a dry plasma etch process. The plasma is generated from an oxygen-containing gas which also replenishes depleted oxygen in the first HTS layer at the ramp edge.

A normal-superconductive (NS) structure or preferably the above-described SNS structure can be formed on the ramp edge following the plasma etch step. The respective resulting SNS and SSNS junctions each have improved electrical properties as compared to known SNS junctions.

The SNS and NS structures are preferably formed in-situ on the ramp edge to minimize contamination.

An optional implant step can be performed to delineate the SSNS or SNS junction region. This step can be performed before of after the SNS (or NS) structure is formed on the ramp edge.

DRAWINGS

These and other features, aspects and advantages of the present invention will become better understood from the following description, appended claims and accompanying drawings, where:

FIGS. 1a–1d are an illustrational flow chart of the steps of forming an SNS Josephson junction according to a known process.

DESCRIPTION

Figure 2D:
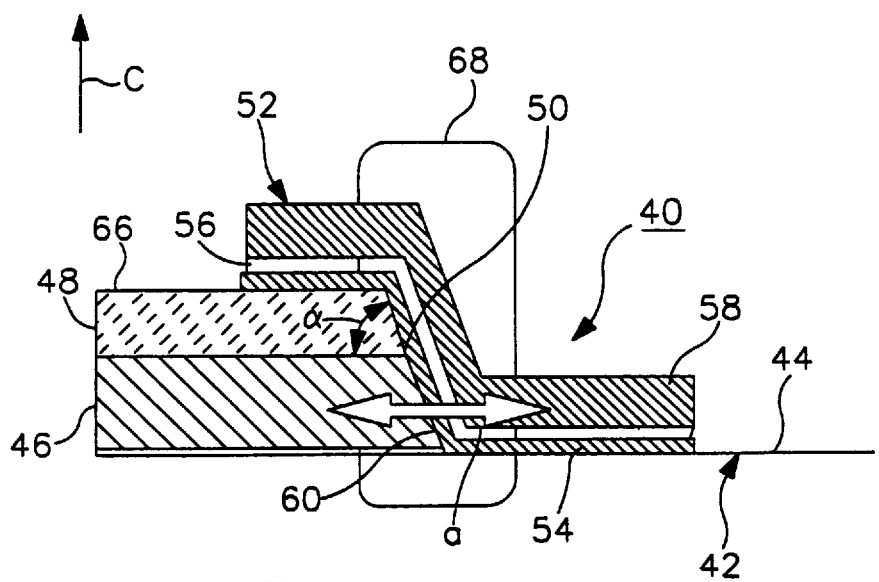
Figure 3:
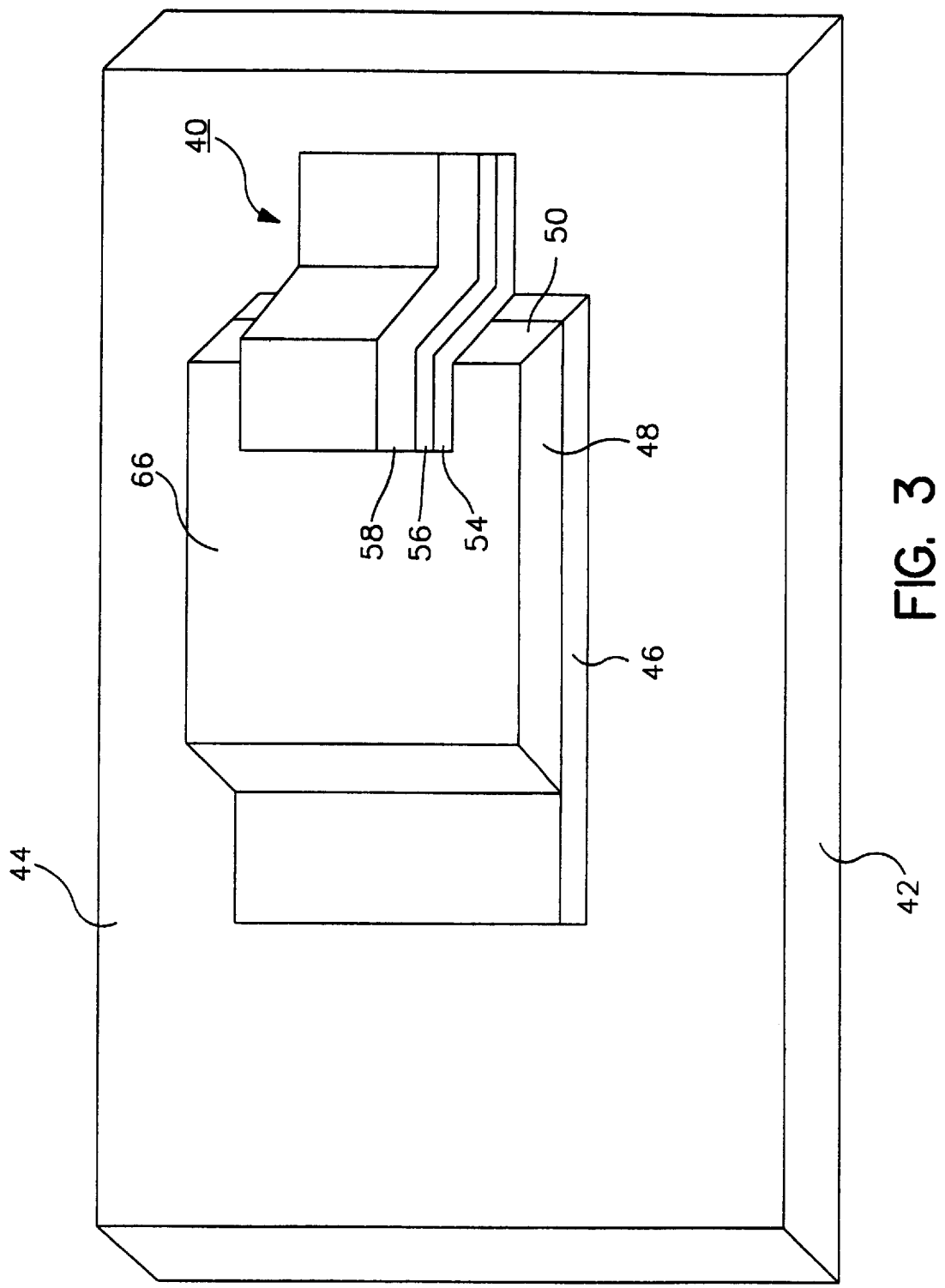
FIG. 3, is a perspective view of the SSNS junction of FIG. 2d.
Figure 4:
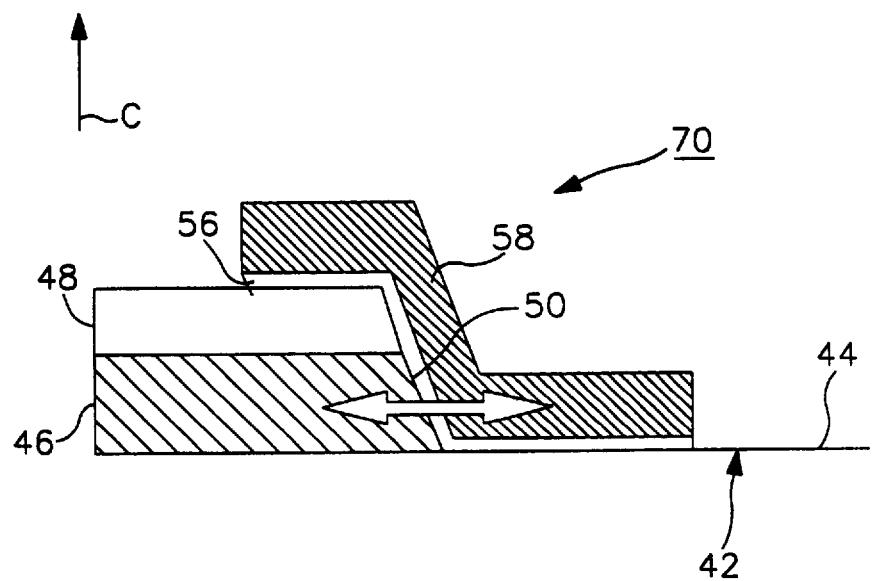
FIG. 4 illustrates an improved SNS Josephson junction according to another embodiment of the present invention.

The present invention is directed to a high-temperature superconducting junction having improved quality and performance characteristics and a method of forming the junction. The superconducting junction can be a superconductive—superconductive-normal-superconductive (SSNS) junction 40 as shown in FIGS. 2d and 3, or a superconductive-normal-superconductive (SNS) junction 70 as shown in FIG. 4.

FIGS. 1a–1d illustrate sequential steps of a known process for forming a known SNS junction structure 10. The process comprises depositing a first high-$T_c$ superconductive (HTS) layer (base electrode layer) 12 and a dielectric layer 14 on a substrate 16. As used herein, the term "$T_c$" is the critical temperature below which superconductive materials exhibit zero electrical resistivity, and "high-$T_c$ superconductive materials" are materials that are superconductive above about 25 K. A photoresist layer 18 is formed on the dielectric layer 14 and the photoresist layer 18 is then patterned to form an inclined surface 20. As depicted in FIG. 1b by arrows I, ion mill etching is then performed to remove a portion of the dielectric layer 14 and the first HTS layer 12 to define an inclined ramp edge 22 as shown in FIG. 1c.

The photoresist layer 18 is then stripped from the dielectric layer 14, typically using a wet chemical stripping process. The ex-situ wet stripping process can contaminate and deoxygenate the ramp edge 22. Superconductive materials such as yttrium-barium-copper oxide (YBCO) are very reactive and exposed surfaces of thin films of these materials are easily contaminated by contact with air during photolithographic processing and, as a result, not able to support the growth of overlying deposited layers with the preferred crystal structure. In addition, the superconducting properties of the contaminated films can be degraded.

To remove contamination, the ramp edge 22 can be cleaned using a low-energy ion cleaning process to form the first HTS layer 12 and the dielectric layer 14.

Next, a barrier layer 24 comprised of a normal material and a second high-$T_c$, superconductive (HTS) layer 26 (counterelectrode layer) are sequentially deposited on the ramp edge 22. As used herein, "normal materials" are materials that are non-superconductive at the temperature of operation of the Josephson junction.

Finally, the SNS structure is patterned and defined using a conventional photoresist masking technique followed by ion-mill etching to form the SNS junction 10 shown in FIG. 1d. The c-axis direction is indicated by the arrow c. In the SNS junction 10, the current flow path is to/from the first HTS layer 12 laterally in the direction of the a-axis (represented by arrow a in FIG. 1d) across the first HTS layer 12, and the barrier layer 24 to/from the second HTS layer 26.

The low-energy ion cleaning of the ramp edge 22 removes the top few contaminated monolayers of the first HTS layer 12, but also produces undesirable lattice damage in the ramp edge 22. Consequently, the structure and quality of the interface 28 between the first HTS layer 12 and the barrier layer 24 are degraded. The interface 28 is resistive and/or non-uniform, which adversly impacted the uniformity of the characteristic voltage $V_c$ of the junction 10. $V_c=I_cR_n$, where $I_c$ is the critical Josephson junction current, the maximum supercurrent that the junction can sustain, and $R_n$, is the electrical resistivity of the Josephson junction. As a result, large scale HTS integrated circuits integrating the junction 10 cannot be fabricated.

The present invention overcomes the problem of interfacial resistance associated with the known SNS Josephson junction 10 and provides a superconducting junction having improved operational performance.

FIGS. 2d and 3 illustrate a superconductive—superconductive-normal-superconductive (SSNS) Josephson junction 40 according to the present invention. The junction 40 is formed on a substrate 42 having a planar upper surface 44. The junction 40 comprises a first high-$T_c$ superconductive (HTS) layer 46 (first base electrode layer) comprised of a high-$T_c$ superconductive material provided on the upper surface 44 of the substrate 42, and a dielectric layer 48 disposed on the first HTS layer 46. The dielectric layer 48 is comprised of a suitable dielectric material to provide electric insulation between the first HTS layer 46 and overlying layers as described below.

The first HTS layer 46 and the dielectric layer 48 define an inclined face referred to herein as the ramp edge 50.

A trilayer SNS structure 52 is disposed on the ramp edge 50. The trilayer SNS structure 52 comprises a second high-$T_c$, superconductive (HTS) layer 54 (second base electrode layer) of a high-$T_c$ superconductive material directly on the ramp edge 50, a barrier layer 56 of a normal material on the second HTS layer 54, and a third high-$T_c$ superconductive (HTS) layer 58 (counterelectrode layer) comprised of a high-$T_c$ superconductive material on the barrier layer 56.

In the SSNS junction 40, the first HTS layer 46, second HTS layer 54 and third HTS layer 58 are preferably epitaxial with a c-axis substantially normal to the upper surface 44 of the substrate 42 as represented by arrow c in FIG. 2d. The dielectric layer 48 and the barrier layer 56 are typically also epitaxial with a c-axis in substantially the same direction as the superconductive layers.

In the SSNS Josephson junction 40, the ramp edge 50 does not directly contact the barrier layer 56. Rather, the ramp edge 50 advantageously directly contacts the second HTS layer 54. As a result, the junction 40 eliminates the problem of electric resistance and non-uniformity at the interface 28 between the first HTS layer 12 and the barrier layer 24 in the known SNS junction 10.

In addition, the present invention overcomes the problems associated with known directional dependent processes.

The high-$T_c$ SSNS Josephson junction 40 provides strong phase coupling of the superconductive Cooper electron pairs between the first HTS layer 46 and the second HTS layer 54, and significantly reduces any detrimental effects caused by the presence of contamination at the interface 60 at the ramp edge 50. The trilayer SNS structure 52 preserves the quality of the interface between the second HTS layer 54 and the barrier layer 56 and the interface between the barrier layer 56 and the third HTS layer 58. The resulting SSNS Josephson junction 40 provides low interfacial electric resistance between the first HTS layer 46 and the second HTS layer 54, and enhanced $I_cR_n$, uniformity.

A method of forming the high-$T_c$ SSNS Josephson junction 40 according to the present invention is depicted in FIGS. 2a–2d. The SSNS Josephson junction 40 is formed on the upper surface 44 of the substrate 42. The substrate 42 is typically comprised of a dielectric material that, has lattice parameters closely matching that of the crystallographic face of the first HTS layer 46 perpendicular to the c-axis; i.e., the face in the a-axis direction. The substrate 42 is typically a single crystal material. An excellent material for the substrate 42 is lanthanum aluminate ($LaAlO_3$) which promotes c-axis epitaxial growth of $YBa_2Cu_3O_{7-x}$ (YBCO). Other suitable substrate 42 materials that promote c-axis epitaxial growth of YBCO can also be used, including $SrTiO_3$ (strontium titanate), neodymium gallate, strontium aluminum tantalate and the like. For high-$T_c$ superconductive materials other than YBCO forming the first HTS layer 46, the substrate 42 can be comprised of $LaAlO_3$ and other suitable materials that promote c-axis epitaxial growth of the first HTS layer 46.

The first HTS layer 46 (first base electrode layer) is comprised of a high-$T_c$ superconductive material deposited as a thin film on the upper surface 44 of the substrate 42. The first HTS layer 46 is typically comprised of a high-$T_c$ superconductive material selected from the YBCO system ($YBa_2Cu_3O_{7-x}$, where x is typically a low value of about 0.1). These materials have a critical temperature, $T_c$, of about 85 K to about 92 K when deposited as a thin film. Other suitable high-$_c$ superconductive materials can be used to form the first HTS layer 46. Such other materials include, for example, compounds of the system $A_2B_2Ca_nCu_{n+1}O_{2n+6}$, where n=0, 1, 2, 3 or 4, A=Bi or Tl, and B=Sr or Ba; and compounds of the system $LnBa_2Cu_3O_{7-x}$, where Ln=Nd, Sm, Er, Gd, Dy, Ho, Er, Tm or Lu.

The first HTS layer 46 is epitaxially grown on the substrate 42 in the c-axis direction represented by arrow c, using a conventional thin film deposition process. Preferably, a physical vapor deposition (PVD) process is used to restrict contamination levels. Suitable PVD processes include, for example, laser ablation, sputtering and the like.

The first HTS layer 46 typically has a thickness of from about 1000 Å to about 4000 Å.

Next, the dielectric layer 48 is deposited on the first HTS layer 46 in-situ in the same deposition system. The dielectric layer 48 is typically epitaxially grown in the c-axis direction using a suitable thin film deposition process such as, laser ablation, sputtering and the like. The dielectric layer 48 is comprised of a suitable dielectric material such as $SrTiO_3$, $LaAlO_3$, neodymium gallate, strontium aluminum tantalate and the like.

The dielectric layer 48 typically has a thickness of from about 500 Å to about 3000 Å.

Next, a photoresist layer 62 is deposited on the dielectric layer 48. The photoresist layer 62 is comprised of a conventional material and is patterned using a conventional photoresist masking technique to enable the subsequent formation of the ramp edge 50 shown in FIGS. 2c and 2d.

The ramp edge 50 is typically formed by a conventional ion mill etching process. As shown in FIG. 2d, the ramp edge 50 is inclined upwardly at an angle $\alpha$ relative to the planar upper surface 44 of the substrate 42. This angle is typically from about 5° to about 90°, and preferably from about 5° to about 30°.

The photoresist layer 62 can be removed using a conventional wet stripping process performed at ambient conditions. This step can, however, contaminate the ramp edge 50 surface.

According to the present invention, the photoresist layer 62 is preferably stripped in the same vacuum system and not exposed to room ambient conditions and wet etching chemicals. Particularly, instead of breaking vacuum and removing the as formed structure for wet etching, the structure is maintained within the vacuum system and the photoresist layer 62 is stripped in-situ by contact with a plasma generated from an oxygen containing gas such as $O_2$. Consequently, potential contamination of the ramp edge 50 surface is minimized.

In addition, the plasma dry etch process can reoxidize oxygen-depleted regions of the high-$T_c$ superconductive material forming the first HTS layer 46 to ensure a high-$T_c$ value is maintained.

The plasma etch step is preferably performed in the system used to subsequently form the trilayer SSNS structure 52. For example, the plasma etch of the photoresist layer 62 can be performed in a common vacuum chamber, or preferably in a dedicated vacuum chamber used for photoresist stripping, located within a multi-chamber, multi-function cluster tool system.

A suitable cluster tool system for performing these steps is the cluster tool system manufactured by DCA Inc. Other companies that manufacture cluster tool systems included Applied Material, LAM Research, Leskers and the like.

The plasma etch removal of the photoresist layer 62 produces minimal chemical damage to the ramp edge 50. As represented by arrows I in FIG. 2b, low-energy ion cleaning can be used to clean the ramp edge 50 to remove any such minimal contamination before forming the trilayer SNS structure 52.

After the ramp edge 50 is cleaned following plasma etching, the barrier layer 56 and the third HTS layer 58 can be sequentially deposited on the ramp edge 50 to produce an SNS junction 70 shown in FIG. 4. The SNS junction 70 has reduced interfacial resistance and increased uniformity between the first HTS layer 46 and the overlying barrier layer 56 as compared to the known SNS junction 10 shown in FIG. 1d.

Preferably, the trilayer SNS structure 52 is formed on the ramp edge 50 to produce the SSNS junction 40. The trilayer SNS structure 52 comprises the second HTS layer 54 (second base electrode layer) disposed directly on the ramp edge 50, the barrier layer 56 on the second HTS layer 54, and the third HTS layer 58 (counterelectrode layer) on the barrier layer 56. By forming the trilayer SNS structure 52 on the ramp edge 50, the advantages of using plasma etching to remove the photoresist layer 62 and the advantages provided by the trilayer SNS structure 52 are realized in the resulting SSNS junction 40.

Figure 2A:
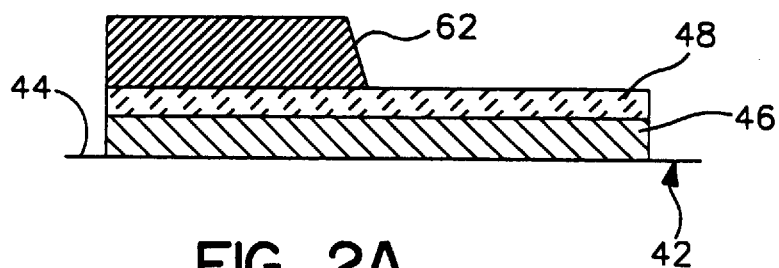
FIGS. 2a–2d are an illustrational flow chart of the steps of forming an improved SSNS Josephson junction according to the present invention.
Figure 2B:
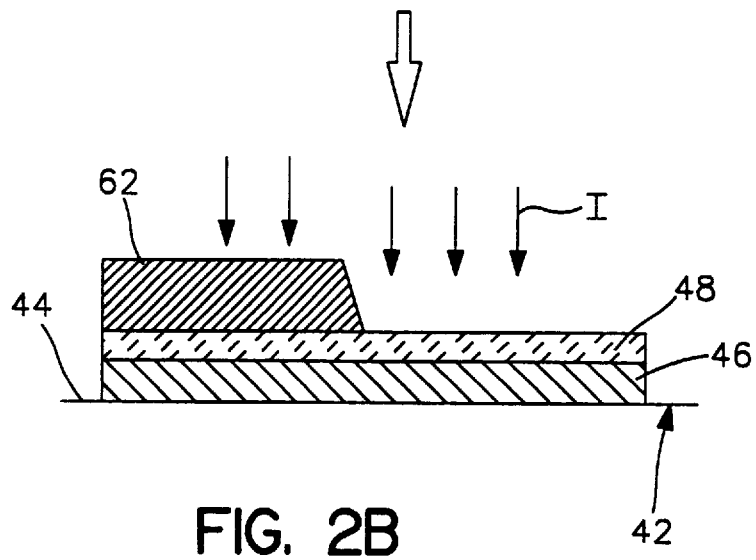
Figure 2C:
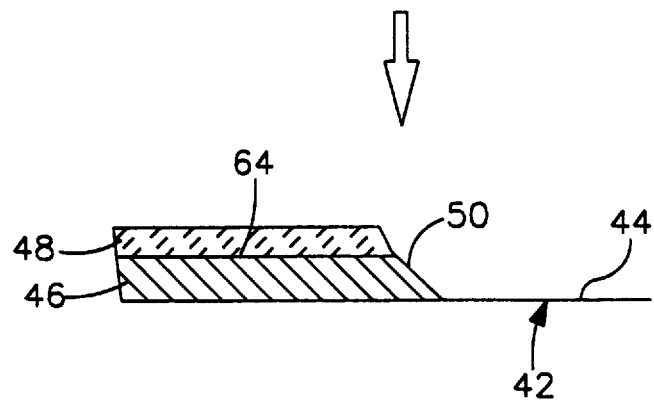

The trilayer SNS structure 52 is preferably formed in-situ in the same system used to form the structure illustrated in FIG. 2c without breaking the vacuum; i.e., the same vacuum system, or alternately, a dedicated vacuum chamber for SNS film deposition within the same multi-chamber cluster tool system.

The second HTS layer 54 is deposited so that it overlies the ramp edge 50, the upper surface 44 of the substrate 42, and a portion of the upper surface 66 of the dielectric layer 48. The second HTS layer 54 is preferably comprised of the same high-$T_c$ superconducting material as the first HTS layer 46 to provide matched lattice parameters, coefficients of thermal expansion and electrical properties, as well as chemical compatibility.

The second HTS layer 54 typically has a thickness of from about 100 Å to about 1000 Å, and preferably has a thickness of less than about 500 Å. It is advantageous to maintain the second HTS layer 54 at a thickness of less than about 500 Å so that the cross-sectional area of the second HTS layer 54 is maintained small also. If this cross-sectional area is too large, the portions of the second HTS layer 54, the barrier layer 56 and the third HTS layer 58 overlying the upper surface 66 of the dielectric layer 48 can function as part of the junction and effectively increase the junction geometry.

The second HTS layer 54 is preferably epitaxially grown in the c-axis direction using a suitable thin film deposition technique such as used to form the first HTS layer 46.

Next, preferably without breaking vacuum in the deposition system, the barrier layer 56 is deposited on the second HTS layer 54. The barrier layer 56 is comprised of a normal material that is non-superconductive at the temperature of operation of the SSNS junction 40. Suitable materials include cobalt-doped YBCO, cobalt-doped praseodymium barium copper oxide (cobalt-doped PBCO), gallium-doped PBCO and the like.

The barrier layer 56 typically has a thickness of from about 50 Å to about 1000 Å. The barrier layer 56 is typically also epitaxially grown in the c-axis direction on the second HTS layer 54 using a suitable thin film deposition technique.

Next, preferably without breaking vacuum, the third HTS layer 58 is deposited on the barrier layer 56. The third HTS layer 58 is typically formed of the same high-$T_c$ superconductive material used to form the second HTS layer 54 and the first HTS layer 46.

The third HTS layer 58 typically has a thickness of from about 500 Å to about 5000 Å and is typically also epitaxially grown in the c-axis direction using a suitable thin film deposition technique. The third HTS layer 58 can be deposited using the same thin film deposition technique used to form the first HTS layer 46 and the second HTS layer 54.

Following deposition of the second HTS layer 54, the barrier layer 56 and the third HTS layer 58, the trilayer SNS structure 52 is typically patterned and defined using a conventional photoresist masking technique followed by ion-mill etching, to produce the SSNS Josephson junction 40 as shown in FIG. 2d.

According to the present invention, an optional implant maskstep can be performed after the trilayer SNS structure 52 is formed as depicted at 68 in FIG. 2d. The implant step delineates the junction region by implanting a suitable species such as silicon ions effective to destroy the superconductive characteristics of the second HTS layer 54 away from the trilayer SNS structure 52. A conventional ion implantation technique can be used to implant the species.

In the SSNS Josephson junction 40, the current flow path is from/to the first HTS layer 46 laterally (in the a-axis direction) across the second HTS layer 54, and the barrier layer 56 laterally to/from the third HTS layer 58, as depicted by the arrow a in FIG. 2d. The thinness of the second HTS layer 54 minimizes parasitic junction leakage current. Reduced phase coupling of superconducting current Cooper pairs in the c-axis direction significantly reduces the parasitic junction leakage current.

As compared to the known SNS junction 10 shown in FIG. 1d, the present SSNS Josephson junction 40 has reduced base electrode layer (second HTS layer 54) to barrier layer 56 interface electrical resistance, enhanced $I_c$, and enhanced $V_c$ uniformity.

As an example, an SSNS junction 40 including a first HTS layer 46, a second HTS layer 54 and a third HTS layer 58 comprised of YBCO, an upper layer comprised of strontium titanate, a normal barrier layer 56 comprised of cobalt-doped YBCO, and having a width of about 4 microns typically has a $I_c$ value of from about 100 microamps to about 500 microamps, and a $V_c$ value of from about 100 microvolts to about 400 microvolts.

The present invention can be used in HTS integrated circuits having enhanced gate complexity. The high $V_c$ of the present invention enables larger signal values for improved output driving capability and improved immunity against background noise, and also high speed of operation.

Furthermore, the base electrode formed of the first HTS layer 46 and the second HTS layer 54, and the counterelectrode (third HTS) layer 58 can be used as separate interconnect layers, allowing one layer to cross over the other layer.

Although the present invention has been described in considerable detail with reference to certain preferred versions thereof, other versions are possible. Therefore, the scope of the appended claims should not be limited to the description of the preferred versions contained herein.

What is claimed is:

1. A high-$T_c$ superconducting Josephson junction, comprising:
   a) a substrate having a surface;
   b) a first high-$T_c$ superconductive layer on the surface of the substrate, the first high-$T_c$ superconductive layer having a first thickness;
   c) a dielectric layer on the first high-$T_c$ superconductive layer;
   d) a ramp edge on the first high-$T_c$ layer and the dielectric layer, the ramp edge being inclined in a nondirectional dependent disposition relative to the surface of the substrate;
   e) a second high-$T_c$ superconductive layer on the ramp edge, the second high-$T_c$ superconductive layer having a second thickness less than the first thickness;
   f) a barrier layer on the second high-$T_c$ superconductive layer, the barrier layer being comprised of a normal material that is non-superconductive at the operating temperature of the superconducting junction; and
   g) a third high-$T_c$ superconductive layer on the barrier layer, wherein
      each of said first, second and third high-$T_c$ superconductors are of uniform thickness.

2. The superconducting junction of claim 1, wherein the first high-$T_c$ superconductive layer, the second high-$T_c$ superconductive layer and the third high-$T_c$ superconductive layer are comprised of the same high-$T_c$ superconductive material.

3. The superconducting junction of claim 2, wherein the high-$T_c$ superconductive material is a material selected from the group consisting of YBCO; $A_2B_2Ca_nCu_{n+1}O_{2n+6}$, where n=0, 1, 2, 3 or 4, A=Bi or Tl, and B=Sr or Ba; and $LnBa_2Cu_3O_{7-x}$, where Ln=Nd, Sm, Er, Gd, Dy, Ho, Er, Tm or Lu.

4. The superconducting junction of claim 3, wherein the dielectric layer is comprised of a material selected from the group consisting of $SrTiO_3$, $LaAlO_3$, neodymium gallate and strontium aluminum tantalate, and the barrier layer is comprised of a material selected from the group consisting of cobalt-doped YBCO, cobalt-doped PBCO and gallium-doped PBCO.

5. The superconducting junction of claim 1, wherein the second high-$T_c$ superconductive layer has a thickness of from about 100 Å to about 1000 Å.

6. The superconducting junction of claim 5, wherein the second high-$T_c$ superconductive layer has a thickness of less than about 500 Å.

7. The superconducting junction of claim 1, wherein the ramp edge is oriented at an angle of from about 5° to about 30° relative to the surface of the substrate.

8. The superconducting junction of claim 1, wherein the first high-$T_c$ superconductive layer, the second high-$T_c$ superconductive layer, the barrier layer and the third high-$T_c$ superconductive layer are epitaxial with a c-axis in a direction substantially normal to the surface of the substrate.

9. A high-$T_c$ superconducting Josephson junction, comprising:
   a) a substrate having a surface;
   b) a first high-$T_c$ superconductive layer on the surface of the substrate, the first high-$T_c$ superconductive layer having a first thickness;
   c) a dielectric layer on the first high-$T_c$ superconductive layer;
   d) a ramp edge on the first high-$T_c$ superconductive layer and the dielectric layer, the ramp edge being inclined in nondirectional dependent disposition relative to the surface of the substrate;
   e) a second high-$T_c$ superconductive layer on the ramp edge, the second high-$T_c$ superconductive layer having a second thickness less than the first thickness;
   f) a barrier layer on the second high-$T_c$ superconductive layer, the barrier layer being comprised of a normal material that is non-superconductive at the operating temperature of the superconducting junction; and
   g) a third high-$T_c$ superconductive layer comprised of a high-$T_c$ superconductive material on the barrier layer;
   h) wherein i) the first high-$T_c$ superconductive layer, the second high-$T_c$ superconductive layer, the barrier layer and the third high-$T_c$ superconductive layer are epitaxial with a c-axis substantially normal to the surface of the substrate, ii) the first high-$T_c$ superconductive layer, the second high-$T_c$ superconductive layer and the third high-$T_c$ superconductive layer are comprised of the same high-$T_c$ superconductive material, and iii) the second high-$T_c$ superconductive layer has a thickness of less than about 500 Å.

* * * * *